(12) United States Patent
Hauck et al.

(10) Patent No.: US 8,043,787 B2
(45) Date of Patent: Oct. 25, 2011

(54) NEGATIVE-WORKING IMAGEABLE ELEMENTS WITH IMPROVED ABRASION RESISTANCE

(75) Inventors: Gerhard Hauck, Badenhausen (DE); Celin Savariar-Hauck, Badenhausen (DE); Udo Dwars, Herzberg/Harz (DE); Harald Baumann, Osterode/Harz (DE); Bernd Strehmel, Berlin (DE); Christopher D. Simpson, Osterode (DE)

(73) Assignee: Eastman Kodak Company, Rochester, NY (US)

( * ) Notice: Subject to any disclaimer, the term of this patent is extended or adjusted under 35 U.S.C. 154(b) by 729 days.

(21) Appl. No.: 12/048,452

(22) Filed: Mar. 14, 2008

(65) Prior Publication Data
US 2009/0233227 A1   Sep. 17, 2009

(51) Int. Cl.
 G03F 7/00 (2006.01)
 G03F 7/26 (2006.01)

(52) U.S. Cl. .......... 430/270.1; 430/138; 430/271.1; 430/302; 101/463.1

(58) Field of Classification Search ........ 101/450.1; 430/273.1, 269, 270.1, 294, 300, 302
See application file for complete search history.

(56) References Cited

U.S. PATENT DOCUMENTS

| | | | |
|---|---|---|---|
| 4,394,434 | A | 7/1983 | Rohloff |
| 5,776,240 | A * | 7/1998 | Deller et al. ............ 106/482 |
| 5,866,297 | A * | 2/1999 | Barjesteh et al. ........ 430/258 |
| 6,071,675 | A | 6/2000 | Teng |
| 6,352,811 | B1 | 3/2002 | Patel et al. |
| 6,534,235 | B1 | 3/2003 | Hanabata et al. |
| 6,935,236 | B2 * | 8/2005 | Hiller et al. ............ 101/401.1 |
| 7,217,502 | B2 | 5/2007 | Ray et al. |
| 7,348,062 | B2 * | 3/2008 | Yuan ........................ 428/437 |

FOREIGN PATENT DOCUMENTS

| | | |
|---|---|---|
| EP | 0 950 516 | 10/1999 |
| EP | 1 096 313 | 5/2001 |
| EP | 1 101 608 | 5/2001 |
| EP | 1 462 247 | 9/2004 |
| EP | 1 462 252 | 9/2004 |
| EP | 1 495 864 | 1/2005 |
| EP | 1 508 834 A2 | 2/2005 |
| EP | 1 057 622 | 2/2007 |
| EP | 1 754 597 A2 | 2/2007 |
| EP | 1754597 A2 * | 2/2007 |
| EP | 1 777 067 | 4/2007 |
| EP | 1 795 964 A2 | 6/2007 |
| EP | 1 839 853 | 10/2007 |
| EP | 2 060 405 A1 | 5/2009 |
| WO | WO 2006121172 A1 * | 11/2006 |

OTHER PUBLICATIONS www.aerosil.com (2008).*
Czech. Abstract CS 266298 (Jul. 4, 1998) Michal Ceppan et al.

* cited by examiner

Primary Examiner — Cynthia Kelly
Assistant Examiner — Chanceity Robinson
(74) Attorney, Agent, or Firm — J. Lanny Tucker

(57) ABSTRACT

Negative-working imageable elements are prepared with radiation-sensitive imageable layers that contain surface-modified silica particles such as fumed silica particles and sol-gel silica particles, that are present in an amount of from about 1 to about 40 weight %, have an average particle size of from about 1 to about 500 nm, have surface hydroxy groups, and have a carbon content of from about 0.5 to about 15 weight % that is derived from surface hydrophobic groups having 1 to 30 carbon atoms. The presence of the surface-modified silica particles provides improved abrasion resistance, reduced tackiness, and various other desired properties.

16 Claims, No Drawings

NEGATIVE-WORKING IMAGEABLE ELEMENTS WITH IMPROVED ABRASION RESISTANCE

FIELD OF THE INVENTION

This invention relates to negative-working imageable elements having improved abrasion and scratch resistance, and to methods of imaging and developing these imageable elements particularly to provide lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. Ink is then transferred to the surface of a material upon which the image is to be reproduced. In some instances, ink is first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Imageable elements for the preparation of lithographic printing plates have been developed for use with infrared lasers. Thermally imageable, negative-working imageable elements are described for example in WO 2004/074930 (Baumann et al.) and WO 2007/090550 (Strehmel et al.).

Particulate materials have been incorporated into lithographic printing plate precursors for various reasons. For example, organic polymer particles have been incorporated into such elements for improved press developability as described in U.S. Pat. No. 6,352,811 (Patel et al.). Nanopastes of metallic particles are described for imageable elements in U.S. Pat. No. 7,217,502 (Ray et al.). Core-shell particles have been included in imaging layers so they coalesce upon imaging as described for example in EP 1,057,622 (Fukino et al.).

It is also known to use silica particles in various imageable elements to modify surface properties or to thicken the coated layers. For example, EP 1,096,313A1 (Hanabata) describes the use of silica particles modified with surface phenolic groups in UV-sensitive photoresists, which modified particles tend to agglomerate and provide thickening in the coating formulations. Such phenolic groups, however, tend to inhibit free radical photopolymerization.

PROBLEM TO BE SOLVED

Imageable elements such as lithographic printing plate precursors are generally packaged and shipped after manufacture in multiple units or stacks with interleaving paper between individual elements. During manufacturing, packaging, transport, and subsequent use of the imageable elements, the outermost layers can be scratched or abraded from human or machine handling. Damage to the outer layer of such elements, for example from scratches, can produces "holes" or other defects in the resulting images, which is a major problem.

Another problem in negative-working imageable elements is the tackiness of the imageable layer due to its high concentrations of reactive monomers and oligomers. This problem is a concern in manufacturing, storage, transport, and eventual use by the customer, resulting in undesired press face defects (pressure marks). The problem is particularly evident when such imageable elements are stored in hot and humid conditions and roller defects may result as well as objectionable patterns pressed into the outer surface by the interleaving papers. These defects require the imageable elements to be scrapped at considerable cost and inefficiency.

In addition, some negative-working imageable elements are prepared with an oxygen barrier topcoat that is coated out of an aqueous solvent. Intermixing can occur between the topcoat formulation and the underlying imageable layer formulation and some of the hydrophilic components of the imageable layer may migrate into the topcoat, resulting in reduced element sensitivity and printing performance.

There is a need to improve the abrasion resistance and reduce tackiness of negative-working imageable elements to reduce various defects without any loss in desired imaging, developing, or printing properties.

SUMMARY OF THE INVENTION

This invention provides a negative-working imageable element comprising a substrate having thereon an imageable layer comprising:
  a free radical polymerizable component,
  an initiator composition that provide free radicals upon exposure to imaging radiation,
  a radiation absorbing compound,
  a polymeric binder, and
  surface-modified silica particles that are present in an amount of from about 1 to about 40 weight %, have an average particle size of from about 1 to about 500 nm, have surface hydroxy groups, and have a carbon content of from about 0.5 to about 15 weight % that is derived from surface hydrophobic groups having 1 to 30 carbon atoms.

In some embodiments, the negative-working, infrared radiation-sensitive lithographic printing plate precursor of this invention comprises an aluminum-containing substrate having thereon an imageable layer and optionally a topcoat disposed on the imageable layer,
  the imageable layer comprising:
    a free radical polymerizable component,
    an initiator composition that provide free radicals upon exposure to imaging infrared radiation,
    a radiation absorbing compound,
    a polymeric binder, and
    surface-modified silica particles that are present in an amount of from about 5 to about 20 weight %, have an average particle size of from about 2 to about 80 nm, have surface hydroxy groups, a BET surface of from about 100 to about 250 $m^2/g$, and have a carbon content of from about 0.5 to about 5 weight % that is derived from surface hydrophobic groups that consist essentially of alkyl groups having 1 to 10 carbon atoms or phenyl groups.

In some embodiments, the lithographic printing plate precursors of this invention have a hydrophilic aluminum-containing substrate and can be arranged in a stack of a plurality of lithographic printing plate precursors with interleaving paper between each individual lithographic printing plate precursor.

This invention also provides a method of providing an image comprising:

A) imaging the negative-working imageable element of this invention to provide an imaged element with exposed regions and non-exposed regions, and B) developing the imaged element to remove predominantly only the non-exposed regions.

The negative-working imageable elements of this present invention include those having a single imageable layer as the outermost layer as well as those having an outermost topcoat over the imageable layer.

The present invention provides negative-working imageable elements having improved abrasion resistance, reduced tackiness, and reduced coating degradation when any topcoat is washed off (thus, cleaner pre-rinse solutions in the processor). In addition, we have observed improved water-resistance and durability during printing (higher run length) with the present invention. The improved abrasion resistance and reduced tackiness decreases defects from roller contacts and impressions from interleaving papers.

These advantages were achieved by incorporating the surface modified silica particles (fumed silica particles or sol-gel silica particles) described herein into the imageable layer of the imageable element.

A further advantage was observed in that the viscosity of the coating formulations was influenced very little by the presence of the surface-modified silica particles and therefore standard coating technologies can be used. Silica particles having insignificant or no surface modification cause a considerable viscosity increase in the coating formulations, resulting in coating and drying complications.

DETAILED DESCRIPTION OF THE INVENTION

Definitions

Unless the context indicates otherwise, when used herein, the terms "imageable element", "negative-working imageable element", and "lithographic printing plate precursor" are meant to be references to embodiments of the present invention.

In addition, unless the context indicates otherwise, the various components described herein such as "surface-modified silica particles", "polymeric binder", "radiation absorbing compound", and similar terms also refer to mixtures of such components. Thus, the use of the article "a" or "an" is not necessarily meant to refer to only a single component.

By "single-layer" imageable element, we mean an imageable element of this invention that has only a single layer needed for providing an image. The surface-modified silica particles (defined below) would be located in this single imageable layer that can be the outermost layer. However, such elements may comprise additional non-imaging layers on either side of the substrate and underneath the imageable layer.

By "multilayer" imageable element, we mean an imageable element of this invention that has an imageable layer and a topcoat disposed on that layer. However, such elements may comprise additional non-imaging layers on either side of the substrate. The surface-modified silica particles (defined below) would generally be in the imageable layer and not the topcoat.

By the term "remove predominantly non-exposed regions" during development, we mean that the non-exposed regions of the imageable layer and the corresponding regions of any underlying layers are selectively and preferentially removed by the developer, but not the exposed regions.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements can be used in a number of ways such as precursors to lithographic printing plates as described in more detail below. However, this is not meant to be their only use. For example, the imageable elements can also be used as thermal patterning systems and to form masking elements and printed circuit boards.

The negative-working radiation-sensitive composition may have any utility wherever there is a need for an applied coating that is polymerizable by exposure to suitable imaging radiation, and particularly where it is desired to remove unexposed regions of the coating instead of exposed regions. The radiation-sensitive compositions can be used to prepare an imageable layer in imageable elements such as printed circuit boards for integrated circuits, microoptical devices, color filters, photomasks, and printed forms such as negative-working lithographic printing plate precursors that are defined in more detail below.

Surface-Modified Silica Particles

The surface-modified silica particles used in the imageable layers according to this invention can be fumed silica particles or sol-gel silica particles that are generally present in an amount of from about 1 to about 40 weight %, have an average particle size of from about 1 to about 500 nm, have surface hydroxy groups, and have a carbon content of from about 0.5 to about 15 weight % that is derived from surface hydrophobic groups having 1 to 30 carbon atoms.

In addition, the useful surface-modified silica particles are "inert" meaning that they do not react with the surrounding polymeric binder or other components of the imageable layer to any appreciable extent. Such reactivity is not needed for providing the desired properties of this invention.

The particles are also generally discrete, meaning that they are uniformly dispersed in the polymeric binder throughout the imageable layer. There is may be minor amounts of clumping or agglomeration but it is generally not present. To achieve such uniform dispersions, the surface-modified silica particles can be mixed well into the one or more polymeric binders using the ball mill, sand mill, high-shear fluid flow mill, or other well known mixing techniques. With the selection of appropriate additives (such as surfactants described below), stable dispersions of the particles in organic solvents can be obtained in desired proportions to provide formulations to provide optimum properties.

The surface-modified silica particles generally have an average particle size of from about 1 nm to about 500 nm, and typically from about 2 to about 80 nm, as measured using conventional procedures. These particles are generally present in the imageable layer in an amount of at least 1 weight %, and typically from about 1 to about 40 weight % or from about 5 to about 20 weight %, based on the total imageable layer dry weight.

The surface-modified silica particles can also have a BET surface value of from about 50 to about 400 $m^2/g$ and typically from about 100 to about 300 $m^2/g$ (for example, from about 120 to about 220 $m^2/g$). BET surface values are determined using known techniques (see for example, http://en.wikipedia.org/wiki/BET_theory and literature cited therein) and machines (see for example, http://kristall.uni-mki.g-wdg.de/english/docs/BET.htm).

The surface hydrophobic groups include surface alkyl groups having 1 to 30 carbon atoms (either linear or branched alkyl groups, as well as substituted or unsubstituted alkyl groups such as benzyl groups) or surface aryl groups having 6 or 10 carbon atoms in the aromatic ring (including substituted aryl groups such as substituted phenyl and naphthyl groups). In some embodiments, the surface hydrophobic groups consist essentially of surface alkyl groups having 1 to 18 carbon atoms, or phenyl groups. In many embodiments, the carbon content of the surface-modified silica particles is from about 0.5 to about 10 weight % (or from about 0.5 to about 5 weight %).

The surface-modified silica particles can be amorphous or crystalline, but the amorphous particles can be more useful.

The fumed silica particles can be prepared by milling in the presence of an organic solvent and one or more stabilizing surfactants. For example, one way to synthesize the fumed silica particles is to modify the hydrophilic surface of silica particles that have been made by thermal hydrolysis of $SiCl_4$ and milling during wet hydrolysis. The thermal hydrolysis is the preferred method to make the silica particles and under types of thermal hydrolysis flame hydrolysis is preferred over laser, plasma, and hot wall reactor hydrolysis. The surface can be modified with substituted or unsubstituted $C_1$ to $C_{30}$ alkyl groups (including substituted or unsubstituted aralkyl groups) or substituted or unsubstituted aryl groups (such as substituted or unsubstituted phenyl groups) as noted above. A common way of modification is the reaction of alkyl or aryl silanes, $R_n(R'\text{—}O)_{4-n}Si$ or $R_nCl_{4-n}Si$, with silica particles, wherein R is the alkyl or aryl residue to be introduced onto the silica particle surface, R' is an $C_1$ to $C_5$ alkyl group (such as methyl), and n is an integer from 1 to 3 (typically n is 1 or 2).

Furthermore, a structure modification is possible using poly(dimethyl siloxanes), resulting in silicate particles that are surface-modified using hydrophobic poly(dimethyl siloxane) chains. For example, surface modification of silica particles with dimethyldichlorosilane can provide surface modified silica particles having a BET surface of from about 120 to about 220 $m^2/g$ and having a carbon content of from about 0.5 to about 4 weight % is particularly useful.

Commercial starting materials (silica particles) are available from EVONIK under the tradename AEROSIL® R, for example AEROSIL® R 972, AEROSIL® R 974, AEROSIL® R 104, AEROSIL® R 106, AEROSIL® R 202, AEROSIL® R 805, AEROSIL® R, AEROSIL® R 812, AEROSIL® R 816, AEROSIL® R 7200, AEROSIL® R 8200, and AEROSIL® R 9200, from CABOT under tradename CAB-O-SIL® TS, for example, CAB-O-SIL® TS-72o, CAB-O-SIL® TS610, CAB-O-SIL® TS-530, and CAB-O-SIL® TS-500 and from WACKER under the tradename Hydrophobic HDK® H, for example, HDK® H15, HDK® H 17, HDK® H 18, HDK® H20, HDK® H30, HDK® H30RM, and HDK® H2000.

Surface-modified sol-gel silica particles are also useful in the practice of this invention. Such particles can be generally prepared by hydrolyzing a tetraalkylsilane (such as tetramethylsilane or tetraethylsilane) in water to obtain silica nanoparticles having surface hydroxy groups. It is also possible to hydrolyze silica particles. The surface hydroxy groups are then modified to introduce hydrophobic groups as described above. As a result of the surface modification, the particles are available as 10 to 60 weight % solutions in organic solvents. Commercial silica particles and tetraalkylsilanes are available from various sources.

The best way to introduce the surface-modified silica particles into an imageable layer formulation is to prepare a pre-dispersion of the particles by ball milling or other dispersion techniques followed by mixing the pre-dispersion with the coating solution with stirring. The pre-dispersion can be made by dispersing the surface-modified silica particles in solvent at a concentration of from about 10 to about 70 weight % of particles. To get a stable dispersion with a low tendency to agglomeration, a dispersing agent may be added in the dispersing step. Such dispersing agents can be anionic, cationic, or non-ionic surfactants or special polymers like polymers having carboxylic groups. In some cases the binder(s) of the imageable layer formulation can be used as dispersing agents alone or used in combination with other dispersing agents. Commercially available dispersions of surface-modified silica particles are also available for example as VP Disp. CO 1030 from EVONIK, which is a dispersion of 30 weight % fumed silica particles AEROSIL® R 9200 in 1-methoxy-2-propylacetate.

Negative-Working Imageable Compositions and Elements

In the embodiments of this invention, radiation-sensitive compositions comprise:

a free radically polymerizable component,
an initiator composition capable of generating free radicals sufficient to initiate polymerization of free radically polymerizable groups upon exposure to imaging radiation,
a radiation absorbing compound,
a polymeric binder, and
the surface-modified silica particles described above.

The radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated components that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. Nos. 6,309,792 (Hauck et al.), U.S. Pat. No. 6,569,603 (Furukawa), and U.S. Pat. No. 6,893,797 (Munnelly et al.). The free radically polymerizable component can also include carboxy groups as described for example in U.S. Pat. No. 7,153,632 (Saraiya et al.).

The one or more free radically polymerizable components (monomeric, oligomeric, or polymeric) can be present in the radiation-sensitive composition or imageable layer in an amount of at least 10 weight % and up to 70 weight %, and typically from about 20 to about 50 weight %, based on the total dry weight. The weight ratio of the free radically polymerizable component to the total polymeric binders (described below) is generally from about 5:95 to about 95:5, and typically from about 10:90 to about 90:10, or even from about 30:70 to about 70:30.

The radiation-sensitive composition (and imageable layer) also includes an initiator composition that is capable of generating free radicals sufficient to initiate polymerization of all the various free radically polymerizable components upon exposure of the composition to imaging radiation. The initiator composition is generally responsive to imaging radiation corresponding to the spectral range of at least 150 nm and up to and including 1400 nm. Initiator compositions are used that are appropriate for the desired imaging wavelength(s). More typically, they are responsive to either UV (or "violet") radiation at a wavelength of from about 150 to about 475 nm or to infrared radiation of at least 700 nm and up to and including 1200 nm.

In general, suitable initiator compositions comprise initiators that include but are not limited to, amines (such as alkanol amines), thiol compounds, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethyl-arylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). For "violet"-sensitive compositions, the preferred initiators are hexaarylbiimidazoles, oxime esters, or trihalomethyl substituted triazines.

Useful IR-sensitive radiation-sensitive compositions include an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N=N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are useful such as the iodonium salts. In one embodiment, the onium salt has a positively-charged iodonium, (4-methylphenyl)[4-(2-methylpropyl)phenyl]-moiety and a suitable negatively charged counterion. Typically anions for the iodonium initiators are chloride, bromide, nitrated, perchlorate, hexafluorephosphate, tetrafluoroboate, tetraphenylborate, and triphenylbutylborate anions. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Useful boron-containing compounds include organic boron salts that include an organic boron anion such as those described in U.S. Pat. No. 6,569,603 (Furukawa) that is paired with a suitable cation such as an alkali metal ion, an onium, or a cationic sensitizing dye. Useful onium cations for this purpose include but are not limited to, ammonium, sulfonium, phosphonium, iodonium, and diazonium cations. They may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole.

Other useful initiator compositions include one or more azine compounds as described for example in U.S. Pat. No. 6,936,384 (Munnelly et al.). These compounds are organic heterocyclic compounds containing a 6-membered ring formed from carbon and nitrogen atoms. Azine compounds include heterocyclic groups such as pyridine, diazine, and triazine groups, as well as polycyclic compounds having a pyridine, diazine, or triazine substituent fused to one or more aromatic rings such as carbocyclic aromatic rings. Thus, the azine compounds include, for example, compounds having a quinoline, isoquinoline, benzodiazine, or naphthodiazine substituent. Both monocyclic and polycyclic azine compounds are useful.

Useful azine compounds are triazine compounds that include a 6-membered ring containing 3 carbon atoms and 3 nitrogen atoms such as those described in U.S. Pat. No. 6,309,792 (Hauck et al.), U.S. Pat. No. 6,010,824 (Komano et al.), U.S. Pat. No. 5,885,746 (Iwai et al), U.S. Pat. No. 5,496,903 (Watanabe et al.), and U.S. Pat. No. 5,219,709 (Nagasaka et al.).

The azinium form of azine compounds can also be used if desired. In azinium compounds, a quaternizing substituent of a nitrogen atom in the azine ring is capable of being released as a free radical. The alkoxy substituent that quaternizes a ring nitrogen atom of the azinium nucleus can be selected from among a variety of alkoxy substituents.

Halomethyl-substituted triazines, such as trihalomethyl triazines, are useful in the initiator composition. Representative compounds of this type include but are not limited to, 1,3,5-triazine derivatives such as those having 1 to 3 —$CX_3$ groups wherein X independently represent chlorine or bromine atoms, including polyhalomethyl-substituted triazines and other triazines, such as 2,4-trichloromethyl-6-methoxyphenyl triazine, 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, 2-(4-ethoxynaphtho-lyl)-4,6-bis(trichloromethyl)-s-triazine, and 2-(4-(2-ethoxyethyl)-naphtho-1-yl)-4,6-bis(trichloromethyl)-s-triazine], 2-(4-methylthiophenyl)-4,6-bis(trichloromethyl)-2-triazine, 2-(4-chlorophenyl-4,6-bis(trichloromethyl)-2-triazine, 2,4,6-tri(trichloromethyl)-2-triazine, and 2,4,6-tri(tribromomethyl)-2-triazine.

The azine compounds may be used alone or in combination with one or more co-initiators such as titanocenes, mono- and polycarboxylic acids, hexaarylbisimidazoles, as described for example in U.S. Pat. No. 4,997,745 (Kawamura et al.).

Particularly useful initiators for use with IR-sensitive radiation-sensitive compositions are diaryliodonium borates in which the aryl groups of the cation can be substituted or unsubstituted. Possible substituents are described below in relation to Structure (IB). The borate anion has four valences filled with the same or different organic groups, for example, as described below for Structure (IBz).

Useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl)phenyl]-moiety and a suitable negatively charged borate counterion.

Useful diaryliodonium borates include, but are not limited to, those represented by the following Structure (IB):

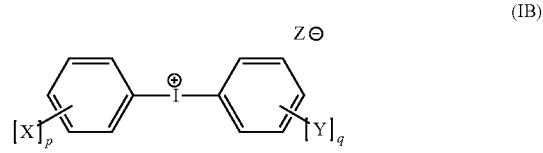

(IB)

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Typically, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated but the "symmetric" compounds (that is, they have the same groups on both phenyl rings) are useful.

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions on either or both phenyl rings.

Despite what type of X and Y groups are present in the iodonium cation, the sum of the carbon atoms in the X and Y substituents generally is at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure IB, p and q are independently 0 or integers of 1 to 5, provided that either p or q is at least 1. Typically, both p and q are at least 1, or each of p and q is 1. Thus, it is understood that the carbon atoms in the phenyl rings that are not substituted by X or Y groups have a hydrogen atom at those ring positions.

$Z^{\ominus}$ is an organic anion represented by the following Structure (IB$_Z$):

(IB$_z$)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazolyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Typically, $R_1$, $R_2$, $R_3$, and $R_4$ are independently substituted or unsubstituted alkyl or aryl groups as defined above, and more typically, at least 3 of $R_1$, $R_2$, $R_3$, and $R_4$ are the same or different substituted or unsubstituted aryl groups (such as substituted or unsubstituted phenyl groups). For example, all of $R_1$, $R_2$, $R_3$, and $R_4$ can be the same or different substituted or unsubstituted aryl groups, or all of the groups are the same substituted or unsubstituted phenyl group. $Z^{\ominus}$ can be a tetraphenyl borate wherein the phenyl groups are substituted or unsubstituted (for example, all are unsubstituted).

Representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)iodonium tetrakis(pentafluorophenyl)-borate, and bis(4-t-butylphenyl)iodonium tetrakis(1-imidazolyl)borate. Mixtures of two or more of these compounds can also be used in the iodonium borate initiator composition.

The diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999).

The various free radical generating compounds (initiators) may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole.

Co-initiators can also be used, such as metallocenes (including titanocenes and ferrocenes), polycarboxylic acids (for example as described in EP 1,079,972 by Hauck et al.), haloalkyl triazines, thiols, or mercaptans (such as mercaptotriazoles), borate salts, and photooxidants containing a heterocyclic nitrogen that is substituted by an alkoxy or acyloxy group, as described in U.S. Pat. No. 5,942,372 (West et al.).

Metallocenes are organometallic compounds that have one or more cyclopentadienyl ligands that are optionally substituted at one or all of the ring carbons. Each carbon in the five-member ligand ring is coordinated to the transition metal center. Metallocenes are known for having a wide variety of transition metals including iron, titanium, tungsten, molybdenum, nickel, cobalt, chromium, zirconium, and manganese.

For example, ferrocenes have an iron center coordinated by at least one cyclopentadienyl ligand, but ferrocenes also include bicyclopentadienyl "sandwich" compounds. Suitable ferrocene compounds include those that have a hexhapto benzene ligand coordinated to the iron center. Examples of such compounds are described in Col. 7 of U.S. Pat. No. 6,936,384 (Munnelly et al.). Other suitable ferrocenes include compounds having halogenated, aryl-substituted, or haloaryl-substituted cyclopentadienyl ligands.

Titanocenes are also useful in the practice of this invention. Such compounds have a titanium center coordinated by at least one pentahapto cyclopentadienyl ligand and generally include additional ligands that may be known for organometallic complexes. Some suitable titanocene compounds include in their structures aryl ligands, haloaryl ligands, or pyrrole-substituted aryl ligands. Examples of useful titanocenes include those described in Col. 8 of U.S. Pat. No. 6,936,384 (noted above). One commercially available titanocene is (bis)cyclopentadienyl-(bis)2,6-difluoro-3-(pyrr-1-yl)phen-1-yl titanium sold by Ciba Specialty Chemicals as Irgacure® 784, as noted below with the Examples. Other suitable titanocenes are described in U.S. Pat. No. 4,548,891 (Riediker et al.), U.S. Pat. No. 4,590,287 (Riediker et al.), U.S. Pat. No. 5,008,302 (Husler et al.), U.S. Pat. No. 5,106,722 (Husler et al.), U.S. Pat. No. 6,010,824 (Komano et al.), and U.S. Pat. No. 6,153,660 (Fujimaki et al.).

It would be recognized by one skilled in the art that not every initiator (or co-initiator) can be used to advantage with every radiation absorbing compound (or sensitizer) described below. For example, some combinations of initiators and sensitizers may be unsuitable for photospeed or other properties, but it would require only routine experimentation in view of the teaching provided herein for a skilled worker to find the optimal combinations of initiators, optional co-initiators, and radiation absorbing compounds for a given spectral sensitivity to provide desired imaging, developability, and storage properties.

The free radical generating initiators in the initiator composition are generally present in the radiation-sensitive composition (or imageable layer) in an amount of at least 0.5% and up to and including 30%, and typically at least 2 and up to and including about 20%, based on total dry weight of the composition (or imageable layer). The optimum amount of the various initiator components (including co-initiators) may differ for various compounds and a given sensitivity of the radiation-sensitive composition can be designed by a one skilled in the art.

The radiation-sensitive composition (and imageable layer) generally includes one or more radiation absorbing compounds (or sensitizers) that absorb imaging radiation (or sensitize the composition to imaging radiation) having a spectral sensitivity of from the UV to the IR region of the electromagnetic spectrum, that is, at least 150 nm and up to and including 1500 nm. Some sensitizers can be used at any wavelength, but most sensitizers are optimally useful within certain wavelength ranges. For example, some sensitizers are optimal for use at an exposing wavelength of at least 150 nm and up to and including 650 nm (UV and violet to visible). Other sensitizers are particularly optimal for use for exposure to UV (violet) radiation of at least 150 nm and up to and including 475 nm, while still others are optimal for use at an exposure wavelength of at least 700 nm and up to and including 1400 nm (near IR and IR).

In some embodiments, the radiation-sensitive composition contains a UV sensitizer where the free-radical generating compound is UV radiation sensitive (that is at least 150 nm and up to and including 475 nm), thereby facilitating photopolymerization. In some other embodiments, the radiation sensitive compositions are sensitized to "violet" radiation in the range of at least 250 nm and up to and including 455 nm. Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.), WO 2004/074929 (Baumann et al.) that describes useful bisoxazole derivatives and analogues, and U.S. Patent Application Publications 2006/0063101 and 2006/0234155 (both Baumann et al.).

Still other useful sensitizers are the oligomeric or polymeric compounds having Structure (I) units defined in WO 2006/053689 (Strehmel et al.) that have a suitable aromatic or heteroaromatic unit that provides a conjugated π-system between two heteroatoms.

Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Sensitizers that absorb in the visible region of the electromagnetic spectrum (that is at least 400 nm and up to and including 650 nm) can also be used. Examples of such sensitizers are well known in the art and include the compounds described in Cols. 17-22 of U.S. Pat. No. 6,569,603 (noted above). Other useful visible and UV-sensitive sensitizing compositions include a cyanine dye and a co-initiator (as described above) as described in U.S. Pat. No. 5,368,990 (Kawabata et al.).

Other useful sensitizers for the violet/visible region of sensitization are the 2,4,5-triaryloxazole derivatives as described in WO 2004/074930 (Baumann et al.). These compounds can be used alone or with a co-initiator as described above. Useful 2,4,5-triaryloxazole derivatives can be represented by the Structure G-$(Ar_1)_3$ wherein $Ar_1$ is the same or different, substituted or unsubstituted carbocyclic aryl group having 6 to 12 carbon atoms in the ring, and G is a furan or oxazole ring, or the Structure G-$(Ar_1)_2$ wherein G is an oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —$N(R'_4)(R'_5)$ group, or a —$OR'_6$ group wherein $R'_4$ through $R'_6$ independently represent substituted or unsubstituted alkyl or aryl groups as defined above. At least one of $R'_1$ through $R'_3$ is an —$N(R'_4)(R'_5)$ group wherein $R'_4$ and $R'_5$ are the same or different alkyl groups. Useful substituents for each $Ar_1$ group include the same or different primary, secondary, and tertiary amines.

Still another class of useful violet/visible radiation sensitizers includes compounds represented by the Structure $Ar_1$-G-$Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, oxazole, or oxadiazole ring. $Ar_1$ is the same as defined above, and $Ar_2$ can be the same or different aryl group as $Ar_1$. "Arylene" can be any of the aryl groups defined for $Ar_1$ but with a hydrogen atom removed to render them divalent in nature.

EP 684,522 (noted above) describes visible radiation-sensitive compositions and imageable elements containing one or more dyes that have a spectral absorption in the range of from about 250 nm to about 700 nm.

In embodiments of this invention that are sensitive to near-infrared or infrared radiation, the radiation-sensitive compositions can comprise an infrared radiation absorbing compound that absorbs radiation of at least 700 nm and up to and including 1500 nm and typically of at least 700 nm and up to and including about 1200 nm.

Useful IR-sensitive radiation absorbing compounds include carbon blacks and other IR-absorbing pigments and various IR-sensitive dyes ("IR dyes"). Examples of suitable IR dyes include but are not limited to, azo dyes, squarilium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), and U.S. Pat. No. 6,787,281 (Tao et al.), and EP 1,182,033A2 (noted above).

A general description of one class of suitable cyanine dyes is shown by the formula in paragraph [0026] of WO 2004/101280 (Munnelly et al.), incorporated herein by reference, and a useful IR absorbing compounds is identified below with the Examples.

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Other useful IR-sensitive dyes having the desired chromophore can be defined by the following Structure DYE-I:

DYE-I

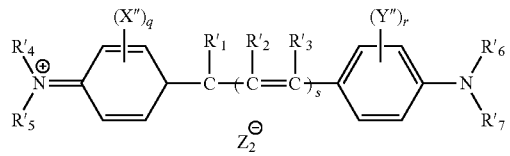

wherein $R_1'$, $R_2'$, and $R_3'$ each independently represents hydrogen, or a halo, cyano, substituted or unsubstituted alkoxy (having 1 to 8 carbon atoms, both linear and branched alkoxy groups), substituted or unsubstituted aryloxy (having 6 to 10 carbon atoms in the carbocyclic ring), substituted or unsubstituted acyloxy (having 2 to 6 carbon atoms), carbamoyl, substituted or unsubstituted acyl, substituted or unsubstituted acylamido, substituted or unsubstituted alkylamino (having at least one carbon atom), substituted or unsubstituted carbocyclic aryl groups (having 6 to 10 carbon atoms in the aromatic ring, such as phenyl and naphthyl groups), substituted or unsubstituted alkyl groups (having 1 to 8 carbon atoms, both linear and branched isomers), substituted or unsubstituted arylamino, or substituted or unsubstituted heteroaryl (having at least 5 carbon and heteroatoms in the ring) group. Alternatively, any two of $R_1'$, $R_2'$, and $R_3'$ groups may be joined together or with an adjacent aromatic ring to complete a 5- to 7-membered substituted or unsubstituted carbocyclic or heterocyclic ring.

For example, $R_1'$, $R_2'$, and $R_3'$ are independently hydrogen, a substituted or unsubstituted carbocyclic aryl group, and a substituted or unsubstituted heteroaryl group.

$R_4'$, $R_5'$, $R_6'$, and $R_7'$ each independently represents hydrogen, a substituted or unsubstituted alkyl group (having 1 to 10 carbon atoms), a substituted or unsubstituted cycloalkyl group (having from 4 to 6 carbon atoms in the ring), a substituted or unsubstituted aryl group (having at least 6 carbon atoms in the ring), or a substituted or unsubstituted heteroaryl group (having 5 to 10 carbon and heteroatoms in the ring).

Alternatively, $R_4'$ and $R_5'$ or $R_6'$ and $R_7'$ can be joined together to form a substituted or unsubstituted 5- to 9-membered heterocyclic ring, or $R_4'$, $R_5'$, $R_6'$, or $R_7'$ can be joined to the carbon atom of the adjacent aromatic ring at a position ortho to the position of attachment of the anilino nitrogen to form, along with the nitrogen to which they are attached, a substituted or unsubstituted 5- or 6-membered heterocyclic ring.

For example, $R_4'$, $R_5'$, $R_6'$, and $R_7'$ are independently a substituted or unsubstituted alkyl group, a substituted or unsubstituted cycloalkyl group, a substituted or unsubstituted aryl group, or $R_4'$ and $R_5'$ or $R_6'$ and $R_7'$ can be joined together to form a substituted or unsubstituted 5- to 7-membered heterocyclic ring. Also, they can be independently substituted or unsubstituted alkyl groups of 1 to 8 carbon atoms, substituted or unsubstituted phenyl groups, or $R_4'$ and $R_5'$ or $R_6'$ and $R_7'$ can be joined together to form a substituted or unsubstituted 5- to 7-membered heteroaryl group.

In the DYE I structure, s is 1, 2, or 3, $Z_2$ is a monovalent anion, X" and Y" are each independently $R_1'$ or the atoms necessary to complete a substituted or unsubstituted 5- to 7-membered fused carbocyclic or heterocyclic ring, and q and r are independently integers from 1 to 4.

For example, X" and Y" are independently hydrogen or the carbon and heteroatoms needed to provide a fused aryl or heteroaryl ring.

Further details of such bis(aminoaryl)pentadiene IR dyes are provided, including representative IR dyes identified as DYE 1 through DYE 17, DYE 19, and DYE 20, in U.S. Pat. No. 6,623,908 (Zheng et al.).

Some useful infrared radiation absorbing dyes have a tetraaryl pentadiene chromophore. Such chromophore generally includes a pentadiene linking group having 5 carbon atoms in the chain, to which are attached two substituted or unsubstituted aryl groups at each end of the linking group. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain.

Such IR-sensitive dyes can be represented by the following Structure DYE-II:

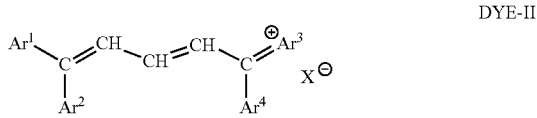

DYE-II wherein $Ar^1$ through $Ar^4$ are the same or different substituted or unsubstituted aryl groups having at least carbon atoms in the aromatic ring (such as phenyl, naphthyl, and anthryl, or other aromatic fused ring systems) wherein 1 to 3 of the aryl groups are substituted with the same or different tertiary amino group (such as in the 4-position of a phenyl group). Typically two of the aryl groups are substituted with the same or different tertiary amino group, and usually at different ends of the polymethine chain (that is, molecule). For example, $Ar^1$ or $Ar^2$ and $Ar^3$ or $Ar^4$ bear the tertiary amine groups. Representative amino groups include but are not limited to those substituted with substituted or unsubstituted alkyl groups having up to 10 carbon atoms or aryl groups such as dialkylamino groups (such as dimethylamino and diethylamino), diarylamino groups (such as diphenylamino), alkylarylamino groups (such as N-methylanilino), and heterocyclic groups such as pyrrolidino, morpholino, and piperidino groups. The tertiary amino group can form part of a fused ring such that one or more of $Ar^1$ through $Ar^4$ can represent a julolidine group.

Besides the noted tertiary groups noted above, the aryl groups can be substituted with one or more substituted or unsubstituted alkyl groups having 1 to 10 carbon atoms, halo atoms (such as chloro or bromo), hydroxyl groups, thioether groups, and substituted or unsubstituted alkoxy groups having 1 to 10 carbon atoms. Substituents that contribute electron density to the conjugated system are useful. While they are not specifically shown in Structure (DYE-II), substituents or fused rings may also exist on (or as part of) the conjugated chain connecting the aryl groups.

In Structure (DYE-II), $X^-$ is a suitable counterion that may be derived from a strong acid, and include such anions as $ClO_4^-$, $BF_4^-$, $CF_3SO_3^-$, $PF_6^-$, $AsF_6^-$, $SbF_6^-$, and perfluoroethylcyclohexylsulfonate. Other cations include boron-containing anions as described above (borates), methylbenzenesulfonic acid, benzenesulfonic acid, methanesulfonic acid, p-hydroxybenzenesulfonic acid, p-chlorobenzenesulfonic acid, and halides.

Some embodiments of this invention include a borate anion, such as a tetra-substituted borate anion, which substituents can be the same or different alkyl (having 1 to 20 carbon atoms) or aryl groups (phenyl or naphthyl groups), which groups can be further substituted if desired. Particularly useful boron-containing counterions of this type include alkyltriarylborates, dialkyldiarylborates, and tetraarylborates. Examples of these boron-containing counterions are described for example, in EP 438,123A2 (Murofushi et al.).

Useful radiation absorbing compounds can be obtained from a number of commercial sources or they can be prepared using known starting materials and procedures.

The radiation absorbing compound (or sensitizer) can be present in the radiation-sensitive composition (and imageable layer) in an amount generally of at least 0.5% and up to and including 30% and typically at least 1 and up to and including 25%, based on total solids. The particular amount needed for this purpose would be readily apparent to one skilled in the art, depending upon the specific compound used to provide the desired chromophore.

The imageable layer includes one or more polymeric binders that provide the desired solubility in alkaline developers before exposure to imaging radiation. The one or more polymeric binders are generally present in the radiation-sensitive composition (imageable layer) in an amount of from about 10 to about 95%, or typically from about 30 to about 90%, based on the total layer dry weight.

In some embodiments, the polymeric binder is a polymer having pendant 1H-tetrazole groups as described in copending and commonly assigned U.S. Ser. No. 11/949,810 (filed Dec. 4, 2007 by Baumann, Dwars, Strehmel, Simpson, C. Savariar-Hauck, and G. Hauck) that is incorporated herein by reference with respect to those polymeric binders.

Other useful polymeric binders include but are not limited to those having one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group ("X") that is not particularly limited. The reactive vinyl groups may be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.). Still other useful polymeric binders have vinyl groups in pendant groups that are described, for example in EP 1,182,033A1 (Fujimaki et al.) and U.S. Pat. No. 4,874,686 (Urabe et al.) and U.S. Pat. No. 7,041,416 (Wakata et al.) that are incorporated by reference, especially with respect to the general formulae (1) through (3) noted in EP 1,182,033A1. Some useful pendant reactive vinyl groups are alkenyl groups including but not limited to allyl esters, styryl, and (meth)acryloyl groups. For example, such groups can be provided by allyl (meth)acrylates, or by reacting a polymer precursor with an allyl halide, 4-vinylbenzyl chloride, or (meth)acryloyl chloride using conditions that would be apparent to a skilled worker in the art.

Additional useful polymeric binders may be any of those known in the art for use in negative-working radiation-sensitive compositions other than those mentioned above.

For example, the polymeric binders may be homogenous, that is, dissolved in the coating solvent, or may exist as discrete particles. Such polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893,797 (Munnelly et al.). Also useful are the vinyl carbazole polymers described in U.S. Pat. No. 7,175,949 (Tao et al.). Copolymers of polyethylene glycol methacrylate/acrylonitrile/styrene in particulate form, dissolved copolymers derived from carboxyphenyl methacrylamide/acrylonitrile/-methacrylamide/N-phenyl maleimide, copolymers derived from polyethylene glycol methacrylate/acrylonitrile/vinyl carbazole/styrene/methyl acrylic acid, copolymers derived from N-phenyl maleimide/methacrylamide/methacrylic acid, copolymers derived from urethane-acrylic intermediate A (the reaction product of p-toluene sulfonyl isocyanate and hydroxylethyl methacrylate)/acrylonitrile/N-phenyl maleimide, and copolymers derived from N-methoxymethyl methacrylamide/methacrylic acid/acrylonitrile/n-phenylmaleimide are useful.

Still other useful polymeric binders are particulate poly(urethane-acrylic) hybrids that are distributed (usually uniformly) throughout the imageable layer. Each of these hybrids has a molecular weight of from about 50,000 to about 500,000 and the particles have an average particle size of from about 10 to about 10,000 nm (typically from about 30 to about 500 nm and or from about 30 to about 150 nm). These hybrids can be either "aromatic" or "aliphatic" in nature depending upon the specific reactants used in their manufacture. Blends of particles of two or more poly(urethane-acrylic) hybrids can also be used. For example, a blend of Hybridur® 570 polymer dispersion with Hybridur® 870 polymer dispersion could be used.

Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that may also include commercial surfactants, anti-foaming agents, dispersing agents, anti-corrosive agents, and optionally pigments and water-miscible organic solvents. Further details about each commercial Hybridur® polymer dispersion can be obtained by visiting the Air Products and Chemicals, Inc. website.

The radiation-sensitive composition and imageable layer can further comprise one or more phosphate (meth)acrylates, each of which has a molecular weight generally greater than 200 and typically at least 300 and up to and including 1000. By "phosphate (meth)acrylate" we also mean to include "phosphate methacrylates" and other derivatives having substituents on the vinyl group in the acrylate moiety.

Each phosphate moiety is typically connected to an acrylate moiety by an aliphatic chain [that is, an -(aliphatic-O)— chain] such as an alkyleneoxy chain [that is an -(alkylene-O)$_m$— chain] composed of at least one alkyleneoxy unit, in which the alkylene moiety has 2 to 6 carbon atoms and can be either linear or branched and m is 1 to 10. For example, the alkyleneoxy chain can comprise ethyleneoxy units, and m is from 2 to 8 or m is from 3 to 6. The alkyleneoxy chains in a specific compound can be the same or different in length and have the same or different alkylene group.

Useful phosphate (meth)acrylates can be represented by the following Structure (III):

wherein n is 1 or 2, M is hydrogen or a monovalent cation (such as an alkali metal ion, ammonium cations including cations that include one to four hydrogen atoms). For example, useful M cations include but are not limited to sodium, potassium, —NH$_4$, —NH(CH$_2$CH$_2$OH)$_3$, and —NH$_3$(CH$_2$CH$_2$OH). When n is 2, the M groups are the same or different. The compounds wherein M is hydrogen are particularly useful.

The R groups are independently the same or different groups represented by the following Structure (IV):

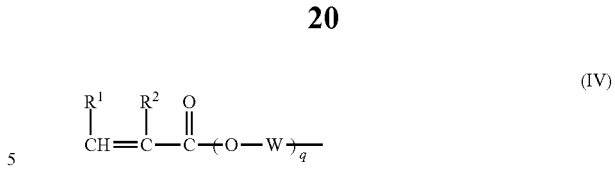

wherein $R^1$ and $R^2$ are independently hydrogen, or a halo (such as chloro or bromo) or substituted or unsubstituted alkyl group having 1 to 6 carbon atoms (such as methyl, chloromethyl, methoxymethyl, ethyl, isopropyl, and t-butyl groups). In many embodiments, one or both of $R^1$ and $R^2$ are hydrogen or methyl, and in some embodiments, $R^1$ is hydrogen and $R^2$ is methyl).

W is an aliphatic group having at least 2 carbon or oxygen atoms, or combination of carbon and oxygen atoms, in the chain, and q is 1 to 10. Thus, W can include one or more alkylene groups having 1 to 8 carbon atoms that are interrupted with one or more oxygen atoms (oxy groups), carbonyl, oxycarbonyl, or carbonyl oxy groups. For example, one such aliphatic group is an alkylenecarbonyloxyalkylene group. Useful alkylene groups included in the aliphatic groups have 2 to 5 carbon atoms and can be branched or linear in form.

The R groups can also independently be the same or different groups represented by the following Structure (V):

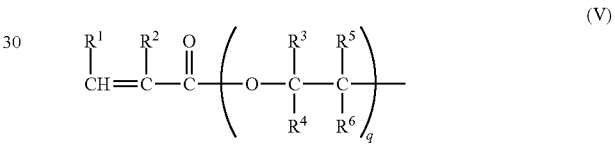

wherein $R^1$, $R^2$, and q are as defined above and $R^3$ through $R^6$ are independently hydrogen or a substituted or unsubstituted alkyl group having 1 to 6 carbon atoms (such as methyl, methoxymethyl), ethyl, chloromethyl, hydroxymethyl, ethyl, iso-propyl, n-butyl, t-butyl, and n-pentyl groups). Typically, $R^3$ through $R^6$ are independently hydrogen or methyl, and in most embodiments, all are hydrogen.

In Structures IV and V, q is 1 to 10, or from 2 to 8, for example from 3 to 6.

Representative phosphate (meth)acrylates useful in this invention are described for example, in U.S. Pat. No. 7,175,969 (Ray et al.).

The phosphate acrylate can be present in an amount of at least 0.5 and up to and including 20% and typically at least 0.9 and up to and including 10%, by weight of the total solids.

The radiation-sensitive composition and imageable layer can further comprise one or more trialkoxysilylalkyl (meth)acrylates or vinyl trialkoxysilanes, each of which has a molecular weight generally greater than 120 and typically at least 145 and up to and including 1,000.

The radiation-sensitive composition (and imageable layer) can also include a "primary additive" that is a poly(alkylene glycol) or an ether or ester thereof that has a molecular weight of at least 200 and up to and including 4000. This primary additive is present in an amount of at least 2 and up to and including 50 weight %, based on the total dry weight. Useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which can be obtained from Sartomer Company, Inc. In some embodiments, the primary additive may be "non-reactive" meaning that it does not contain polymerizable vinyl groups.

The radiation-sensitive composition (and imageable layer) can also include a "secondary additive" that is a poly(vinyl alcohol), a poly(vinyl pyrrolidone), poly(vinyl imidazole), or polyester in an amount of up to and including 20 weight % based on the total dry weight.

The radiation-sensitive composition (and imageable layer) can also include a variety of optional compounds including but not limited to, dispersing agents, humectants, biocides, plasticizers, surfactants for coatability or other properties, viscosity builders, dyes or colorants to allow visualization of the written image (such as crystal violet, methyl violet, ethyl violet, Victoria blue, malachite green, brilliant green, and phthalocyanine pigments such as copper phthalocyanine and metal-free phthalocyanine), pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

The radiation-sensitive composition that is sensitive to UV/violet radiation may include one or more thermopolymerization inhibitors such as those described on page 10 (lines 14-22) of WO 2004/074929 (noted above).

Imageable Elements

The negative-working imageable elements can be formed by suitable application of a radiation-sensitive composition as described above to a suitable substrate to form an imageable layer. This substrate can be treated or coated in various ways as described below prior to application of the radiation-sensitive composition to improve hydrophilicity. Typically, there is only a single imageable layer comprising the radiation-sensitive composition that is directly applied to the substrate without any intermediate layer.

The substrate generally has a hydrophilic surface, or at least a surface that is more hydrophilic than the applied imageable layer on the imaging side. The substrate comprises a support that can be composed of any material that is conventionally used to prepare imageable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of from about 1.5 to about 5 g/m$^2$ and more typically from about 3 to about 4.3 g/m$^2$. Phosphoric acid anodization generally provides an oxide weight on the surface of from about 1.5 to about 5 g/m$^2$ and more typically from about 1 to about 3 g/m$^2$. When sulfuric acid is used for anodization, higher oxide weight (at least 3 g/m$^2$) may provide longer press life.

The aluminum support may also be treated with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support may be treated with a phosphate solution that may further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate may be coated with antistatic agents and/or slipping layers or a matte layer to improve handling and "feel" of the imageable element.

The substrate can also be a cylindrical surface having the imageable layer thereon, and thus be an integral part of the printing press. The use of such imaging cylinders is described for example in U.S. Pat. No. 5,713,287 (Gelbart).

A radiation-sensitive composition containing the components described above can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder).

Illustrative of such manufacturing methods is mixing the free radically polymerizable component, polymeric binder(s), initiator composition, radiation absorbing compound, component having 1H-tetrazole groups, and any other components of the radiation-sensitive composition in a suitable coating solvent including water, organic solvents [such as glycol ethers including 1-methoxypropan-2-ol, methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], or mixtures thereof, applying the resulting solution to a substrate, and removing the solvent(s) by evaporation under suitable drying conditions. Some representative coating solvents and negative-working imageable layer formulations are described in the Examples 1-5 below. After proper drying, the coating weight of the imageable layer is generally at least 0.1 and up to and including 5 g/m$^2$ or at least 0.5 and up to and including 3.5 g/m$^2$.

Thus, in some embodiments, the imageable element may include what is conventionally known as an overcoat (also known as an "oxygen impermeable topcoat" or "oxygen barrier layer") disposed over the imageable layer, for example, as described in EP Patent Publications 1,788,429 (Loccufier et al.), 1,788,431 (Van Damme et al.), and 1,788,434 (Van Damme et al.) and U.S. Patent Application Publication 2005/0266349 (Van Damme et al.). Such overcoat layers comprise a poly(vinyl alcohol) as the predominant polymeric binder. If present, the overcoat is the outermost layer of the imageable element.

Once the imageable layer formulation has been applied and dried on the substrate, and any overcoat formulation has been applied and dried, the imageable element can be enclosed in water-impermeable material that substantially inhibits the transfer of moisture to and from the imageable element.

By "enclosed", we mean that the imageable element is wrapped, encased, enveloped, or contained in a manner such that both upper and lower surfaces and all edges are within the water-impermeable sheet material. Thus, none of the imageable element is exposed to the environment once it is enclosed. Further details of this process of single or stacks of imageable elements are provided in U.S. Pat. No. 7,175,969 (noted above).

Imaging and Development

The imageable elements can have any useful form including, but not limited to, printing plate precursors, printing cylinders, printing sleeves (solid or hollow cores) and printing tapes (including flexible printing webs). For example, the imageable members can be printing plate precursors useful for providing lithographic printing plates having hydrophilic substrates.

Printing plate precursors can be of any size or shape (for example, square or rectangular) having the requisite one or more imageable layers disposed on a suitable substrate. Printing cylinders and sleeves are known as rotary printing members having a substrate and at least one imageable layer in cylindrical form. Hollow or solid metal cores can be used as substrates for printing sleeves.

During use, the imageable elements are exposed to a suitable source of radiation such as UV, visible, or infrared radiation, depending upon the radiation absorbing compound present in the element, for example at a wavelength of from about 150 to about 1500 nm. In some embodiments, imaging can be carried out using in the UV (violet) regions of from about 250 to about 450 nm, and in other embodiments, imaging is carried out using an infrared laser at a wavelength of from about 600 to about 1500 nm and typically from about 700 to about 1400 nm. The lasers used to expose the imageable elements are usually diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 1200 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Kodak Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 1500 mJ/cm$^2$, and typically at least 50 and up to and including 400 mJ/cm$^2$ depending upon the sensitivity of the imageable layer.

Imaging radiation in the UV to visible region of the spectrum, and particularly the UV region (for example at least 250 nm and up to and including 450 nm), can be carried out generally using energies of at least 0.01 mJ/cm$^2$ and up to and including 0.5 mJ/cm$^2$, and typically at least 0.02 and up to and including about 0.1 mJ/cm$^2$. It would be desirable, for example, to image the UV/visible radiation-sensitive imageable elements at a power density in the range of at least 0.5 and up to and including 50 kW/cm$^2$ and typically of at least 5 and up to and including 30 kW/cm$^2$.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable processing solution such an alkaline developer removes the predominantly only the non-exposed regions of the imageable layer and the underlying portions of any underlayers and exposes the hydrophilic surface of the substrate. Thus, the imageable elements are "negative-working" (for example, negative-working lithographic printing plate precursors).

Development is carried out for a time sufficient to remove the predominantly only the non-imaged (non-exposed) regions of the imaged element, but not long enough to remove the exposed regions. Thus, the non-imaged (non-exposed) regions of the imageable layer are described as being "soluble" or "removable" in the developer because they are removed, dissolved, or dispersed within the developer more readily than the imaged (exposed) regions. Thus, the term "soluble" also means "dispersible".

Useful developers include aqueous alkaline developers that generally have a pH of from about 8 to about 14 and more typically of at least 12. Useful alkaline aqueous developers include 3000 Developer, 9000 Developer, GoldStar® Developer, GoldStar® Plus Developer, GoldStar® Premium, GREENSTAR Developer, ThermalPro Developer, PRO- THERM Developer, MX1813 Developer, and MX1710 Developer (all available from Eastman Kodak Company), as well as Fuji HDP7 Developer (Fuji Photo) and Energy CTP Developer (Agfa). These compositions generally include surfactants, chelating agents (such as salts of ethylenediaminetetraacetic acid), and alkaline components (such as inorganic metasilicates, organic metasilicates, hydroxides, and bicarbonates).

More typically, the useful developers are organic solvent-containing developers that can be slightly acidic to moderately alkaline. These developers generally have a lower pH (for example, from about 6 and up to and including 13) and are generally single-phase solutions of one or more organic solvents that are miscible with water, such as 2-ethylethanol and 2-butoxyethanol. Representative solvent-containing alkaline developers include ND-1 Developer, 955 Developer, 956 Developer, 989 Developer, Violet 500, and 980 Developer (all available from Eastman Kodak Company), HDN-1 Developer (available from Fuji), and EN 232 Developer (available from Agfa).

Developers having a pH of from about 4 to about 9 are useful for developing imaged elements in the absence of post-rinse and gumming steps after development (so called "single bath development"). Such developers contain in most cases hydrophilic polymers like gum Arabic, polyvinyl alcohol, poly(acrylic acid), or other hydrophilic polymers to protect the developed plate against fingerprints and to prevent toning of the plate when used on a printing press.

Generally, the developer is applied to the imaged element by rubbing or wiping the outer layer with an applicator containing the developer. Alternatively, the imaged element can be brushed with the developer or the developer may be applied by spraying the outer layer with sufficient force to remove the exposed regions. The imaged element can be immersed in the developer. In all instances, a developed image is produced, particularly in a lithographic printing plate.

Following development, the imaged element can be rinsed with water and dried in a suitable fashion. The dried element can also be treated with a conventional gumming solution (preferably gum arabic). In addition, a postbake operation can be carried out, with or without a blanket exposure to UV or visible radiation. Alternatively, a post-UV floodwise exposure (without heat) can be used to enhance the performance of the imaged element.

For example, the imaged and developed element can also be baked in a postbake operation that can be carried out to increase run length of the resulting imaged element. Baking can be carried out, for example at from about 220° C. to about 240° C. for from about 7 to about 10 minutes, or at about 120° C. for 30 minutes.

A lithographic ink and fountain solution can be applied to the printing surface of the imaged element for printing. The exposed regions of the outermost layer take up ink and the hydrophilic surface of the substrate revealed by the imaging and development process takes up the fountain solution. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

EXAMPLES

The components and materials used in the examples and analytical methods were as follows. Unless otherwise indicated, the components can be obtained from various commercial sources such as Aldrich Chemical Co. (Milwaukee, Wis.).

| | |
|---|---|
| Aerosil ® 200 | Fumed hydrophilic silica particles having an average particle size of 12 nm available form EVONIK (Germany) |
| Desmodur ® N100 | Trifunctional isocyanate (biuret of hexamethylene diisocyanate), that is available from Bayer (Germany) |
| HEMA | (2-Hydroxyethyl)methacrylate |
| HEPi | 2-(2-Hydroxyethyl)piperidine |
| HMDI | Hexamethylene diisocyanate |
| Joncryl ® 683 | Acrylic resin obtained from SC Johnson & Son Inc. having an acid number of 162 mg KOH/g |
| Kayamer PM-2 | Ester of 1 mol phosphoric acid and 1.5 mol hydroxyethyl-methacrylate that is available from Nippon Kayaku (Japan) |
| Nanopol ® C784 | Surface-modified silica particles (NanoResins GmbH, Germany), avg. particle size 20 nm, 29 weight % solution in n-butyl acetate |
| NK Ester BPE-500 | Ethoxylated bisphenol A having methacrylic end groups, that is available from Shin Nakamura (Japan) |
| Polymer P1 | Copolymer derived from methyl methacrylate and methacrylic acid (molar ratio of 87:13) |
| Polymer P2 | Copolymer derived from benzyl methacrylate, N-isopropyl methacrylamide, allyl methacrylate, and methacrylic acid (molar ratio of 27:20:39:13) |
| Polymer P3 | Copolymer derived from N-isopropyl methacrylamide, allyl methacrylate, and methacrylic acid (molar ratio 21:72:7) |
| S1 | 2-Phenyl-4-(2-chlorophenyl)-5-(4-diethylaminophenyl)-oxazole |
| S2 | 4-[(E)-2-(5-t-butyl(1,3-benzoxazol-2-yl))vinyl]-9-ethyl-9H-carbazole |
| VP Disp. CO 1030 | Dispersion of 30 weight-% surface modified silica particles AEROSIL ® R 9200 in 1-methoxy-2-propylacetate that is available from EVONIK (Germany) |

Invention Examples 1-11 and Comparative Examples 1-11

An electrochemically roughened and anodized aluminum foil with an oxide weight of 3 g/m² was subjected to a treatment using an aqueous solution of poly(vinyl phosphoric acid). The average roughness of the surface was 0.55 μm. Imageable layer coating compositions described below in TABLE I, II, and III were applied to the substrate after filtering with a wire bar coater. The coatings were dried for 4 minutes at 90° C. The coating weights were 1.6 g/m² for the formulations sensitized at 405 nm (TABLE I) and 1.4 g/m² for the formulation sensitized at 810 to 830 nm (TABLE II). The formulations of Comparative Examples 5 and 6 did not give a closed photopolymer film on the surface of the lithographic substrate because of too high viscosities.

The imageable layers were then overcoated with an aqueous solution of poly(vinyl alcohol) (Celvol® 203 obtained from Air Products and Chemicals, having a hydrolysis degree of 88%) with a wire bar coater to provide a topcoat having a dry coating weight after drying for 4 minutes at 90° C. 2.1 g/m².

The resulting imageable elements of Examples 1-3 and Comparative Examples 1-3 were exposed using an imagesetter (Andromeda® A750M from Lithotech) that was equipped with a laser diode emitting at 405 nm (P=30 mW). An UGRA gray scale V2.4 with defined tonal values (all data were linearized in order to approximately obtain the desired tonal value) was used as the image. The imaged elements were heated directly after exposure for 2 minutes to 90° C. After washing off the water-soluble topcoat with water, the imaged elements were developed using Violet 500 Developer.

The sensitivity of the imageable elements was determined using an UGRA Offset test scale 1982 with overall flood exposure using the platesetter disclosed above. The "exposure energy" is defined as the energy needed in order to obtain two gray scale steps of an UGRA scale of the developed printing plate. The results are shown in TABLE III.

The UGRA/FOGRA Postscript Strip version 2.0 EPS (available from UGRA), which contains different elements for evaluating the quality of the copies, was used for imaging the elements of Invention Example 4 and Comparative Example 4 using a Kodak® Trendsetter 3244 platesetter (830 nm). The sensitivity (photospeed) of the imageable elements exposed at 830 nm was evaluated by exposing the plate with different energies. The imaged elements were heated directly after exposure for 2 minutes to 90° C. After washing off the water-soluble topcoat with water, the imaged elements were developed using Developer 980. The minimum energy having the lowest deviation of the target tonal values compared to the measured tonal value of the developed plate is defined as the "exposure energy". The results are shown in TABLE III To measure the "developing time" of each imaged element, non-exposed plate stripes of 5×30 cm² were dipped into the corresponding developer in a glass beaker and every 5 seconds, the stripes were lowered 4 cm deeper into the developer. Prior to this, the plates were treated for 2 minutes in an oven at 90° C. After 50 seconds, the stripes were taken out of the developer, rinsed with water, and the time needed to get the first clean step was noted as the developing time. These results are summarized in TABLE III.

The "tackiness" of the surface was defined as the tackiness to finger contact following the a relative scale from 1 to 5 with 1 representing no detectable tackiness to 5 being very tacky.

The "sensitivity against pressure marks from wrinkled interleaf paper" was determined by incubating a stack of non-exposed imageable elements wrapped in aluminum-coated wrapping paper in a climate chamber having a temperature of 40° C. and a relative humidity of 80% for 10 days. Under these conditions, the interleaf paper became wrinkled. This sensitivity was defined in a relative scale of from 1 to 5 with 1 representing no visible pattern from wrinkled interleaf paper visible and 5 representing a very strong pattern from wrinkled interleaf paper visible in the plate surface.

The "sensitivity to roller marks" was measured by rolling a rubber roller with a diameter of 3 cm, a width of 5 cm, and a weight of 150 g, 20 times over the non-exposed element surface. After this treatment, the elements were stored for 60 minutes at 90° C. in an oven. The "pressure sensitivity" was defined on a relative scale from 1 to 5 with 1 representing no visible pressure marks visible and 5 represents strong visible pressure marks.

The "pre-rinse water resistance" was measured by passing the non-exposed element through a dip tank processor filled with water having a temperature of 45° C. and 2 brush rollers covered with plush material contacting the element surface. The dwell time in the warm water bath was 20 seconds. The "pre-rinse water resistance" was defined on a relative scale from 1 to 5 with 1 representing no visible attack to 5 representing a strong visible attack (more than 50% of the element coating area removed).

To measure the "run length", printing plates were loaded in a sheet-fed offset printing machine using abrasive ink (Offset S 7184 available from Sun Chemical that contains 10% of calcium carbonate). The length of run of the plate was the number of copies before the first sign of wear in solid areas of the plate became visible.

TABLE III shows that the imageable elements of this invention having the surface-modified silica particles in the imageable layer had significantly less tackiness and were less sensitive to roller marks and to pressure marks from wrinkled interleaf paper compared to the elements outside of this invention (no surface-modified silica particles). Furthermore, the warm-water resistance was improved in the invention elements. The surface-modified silica particles used in the invention did not have a negative impact on photospeed, developability, and printing run length. However, the use of silica particles that did not have organic surface groups had a strong impact on the viscosity of the imageable layer formulation and known coating technologies could not be used when the particle content was high enough to get the desired improvements that are obtained using the present invention.

To study the influence of surface modified silica particles according to the present invention on intermixing of imageable layer coating and topcoat during drying, different drying temperature and dwell times were studied. The data in TABLE IV shows how the addition of the noted particles according to this invention reduced the intermixing phenomenon, which is expressed by a lowered photospeed (imaging sensitivity). This occurred under certain drying conditions that were readjusted by decreasing the drying temperature. We found that the addition of the surface-modified silica particles according to this invention resulted in an improved resistance of the imageable layer coating in the pre-rinse section and higher photospeed even after insufficient drying.

TABLE I

| | | |
|---|---|---|
| 1.81 g | Polymeric binder corresponding to TABLE III | |
| X g | Particle dispersion corresponding to TABLE III | |

TABLE I-continued

| | | |
|---|---|---|
| 1.89 | g | Dispersion in propylene glycol monomethyl ether containing 9 wt. % of copper phthalocyanine and 1 wt. % of a poly(vinyl acetal) binder containing 39.9 mol % vinyl alcohol, 1.2 mol % vinyl acetate, 15.4 mol % acetal groups from acetaldehyde, 36.1 mol % acetal groups from butyraldehyde, and 7.4 acetal groups from 4-formylbenzoic acid |
| Y | g | Sensitizer corresponding to TABLE III |
| 0.05 | g | Kayamer PM-2 |
| 7.1 | g | Solution of 30 weight % in methyl ethyl ketone of an oligomer made by reaction of HMDI + HEMA + HEPi |
| 0.37 | g | NK Ester BPE-500 |
| 0.17 | g | 2,2-Bis-(-2-chlorophenyl)-4,5,4',5'-tetraphenyl-2'H-[1,2']biimidazolyl |
| 0.31 | g | 1H-1,2,4-triazole-5-thiol |
| 23 | ml | Propylene glycol monomethyl ether |
| 12 | ml | Methanol |
| 16 | ml | Methyl ethyl ketone |

TABLE II

| | | |
|---|---|---|
| 2.72 | g | Copolymer of 20 mol % methacrylic acid and 80 mol % allyl methacrylate, acid number = 95 mg KOH/1 g |
| X | g | Particle dispersion corresponding to TABLE III |
| 0.19 | g | Kayamer PM-2 |
| 1.1 | g | BPE-500 |
| 1.4 | g | Urethane acrylate (80% solution in methyl ethyl ketone; prepared by reacting Desmodur ® N100 with hydroxyethyl acrylate and pentaerythritol triacrylate; amount of double bonds: 0.5 double bonds per 100 g, when all isocyanate groups have reacted) |
| 0.15 | g | Phenylimino diacetic acid |
| 0.07 | g | 2-[2-[2-Thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride |
| 0.39 | g | 2-(4-Methoxyphenyl)-4,6-bis(trichloromethyl)-1,3,5-triazine |
| 0.06 | g | Dispersion in propylene glycol monomethyl ether containing 9 wt. % of copper phthalocyanine and 1 wt. % of a poly(vinyl acetal) binder containing 39.9 mol % vinyl alcohol, 1.2 mol % vinyl acetate, 15.4 mol % acetal groups from acetaldehyde, 36.1 mol % acetal groups from butyraldehyde and 7.4 acetal groups from 4-formylbenzoic acid |
| 0.15 | g | 1H-1,2,4-triazole-5-thiol |
| 38 | ml | Propylene glycol monomethyl ether |
| 4 | ml | Methyl ethyl ketone |

TABLE III

| | Imageable Layer | Polymeric Binder | X g Particles | Y g Sensitizer | Viscosity of imageable layer solution, mPa * sec | Exposure energy |
|---|---|---|---|---|---|---|
| Invention Example 1 | TABLE I | P1 | 1 g VP Disp. CO 1030 | 0.70 g S1 | 2.1 | 50 μJ/cm$^2$ |
| Invention Example 2 | TABLE I | P2 | 0.9 g VP Disp. CO 1030 | 0.70 g S1 | 2.1 | 45 μJ/cm$^2$ |
| Invention Example 3 | TABLE I | P3 | 0.9 g VP Disp. CO 1030 | 0.22 g S2 | 2.1 | 90 μJ/cm$^2$ |
| Invention Example 4 | TABLE II | — | 1 g VP Disp. CO 1030 | — | 2.2 | 100 mJ/cm$^2$ |
| Invention Example 5 | TABLE I | P1 | 1 g Nanopol ® C784 | — | 2.15 | 45 mJ/cm$^2$ |
| Invention Example 6 | TABLE II | — | 1 g Nanopol ® C784 | — | 2.1 | 90 mJ/cm$^2$ |
| Comparative Example 1 | TABLE I | P1 | — | 0.70 g S1 | 2.2 | 50 μJ/cm$^2$ |
| Comparative Example 2 | TABLE I | P2 | — | 0.70 g S1 | 2.2 | 45 μJ/cm$^2$ |
| Comparative Example 3 | TABLE I | P3 | — | 0.22 g S2 | 2.2 | 80 μJ/cm$^2$ |
| Comparative Example 4 | TABLE II | — | — | — | 2.4 | 100 mJ/cm$^2$ |
| Comparative Example 5 | TABLE I | P1 | 1 g Aerosil ® 200 | 0.70 g S1 | >20[1)] | |
| Comparative Example 6 | TABLE II | — | 1 g Aerosil ® 200 | — | >20[1)] | |

TABLE III-continued

|  | Developing time | Tackiness | Sensitivity against pressure marks from wrinkled interleaf paper | Sensitivity to roller marks | Prerinse water resistance | Run Length (copies) |
|---|---|---|---|---|---|---|
| Invention Example 1 | 7 seconds | 1 | 1 | 2 | 1 | 110,000 |
| Invention Example 2 | 7 seconds | 2 | 1 | 1 | 1 | 130,000 |
| Invention Example 3 | 7 seconds | 1 | 1 | 1 | 1 | 120,000 |
| Invention Example 4 | 5 seconds | 1 | 1 | 1 | 1 | 110,000 |
| Invention Example 5 | 7 seconds | 1 | 1 | 2 | 1 | 120,000 |
| Invention Example 6 | 7 seconds | 1 | 1 | 1 | 1 | 110,000 |
| Comparative Example 1 | 7 seconds | 4 | 5 | 5 | 4 | 110,000 |
| Comparative Example 2 | 7 seconds | 5 | 5 | 4 | 4 | 130,000 |
| Comparative Example 3 | 10 seconds | 5 | 4 | 4 | 5 | 120,000 |
| Comparative Example 4 | 5 seconds | 4 | 4 | 3 | 4 | 110,000 |
| Comparative Example 5 |  |  |  |  |  |  |
| Comparative Example 6 |  |  |  |  |  |  |

[1] The high viscosity of the coating solution did not allow making an imageable layer coated film on the lithographic substrate

TABLE IV

|  | Imageable Layer | Temperature in the dryer | Dwell time in the dryer | Polymeric Binder | X g Particles | Y g Sensitizer | Exposure energy | Prerinse water resistance | Run Length (copies) |
|---|---|---|---|---|---|---|---|---|---|
| Invention Example 7 | TABLE I | 60° C. | 1 minute | P3 | 1 g VP Disp. CO 1030 | 0.22 g S2 | 90 µJ/cm$^2$ | 2 | 100,000 |
| Invention Example 8 | TABLE I | 90° C. | 1 minute | P3 | 1 g VP Disp. CO 1030 | 0.22 g S2 | 90 mJ/cm$^2$ | 2 | 110,000 |
| Invention Example 9 | TABLE I | 110° C. | 1 minute | P3 | 1 g VP Disp. CO 1030 | 0.22 g S2 | 80 µJ/cm$^2$ | 1 | 120,000 |
| Invention Example 10 | TABLE I | 110° C. | 0.5 minute | P3 | 1 g VP Disp. CO 1030 | 0.22 g S2 | 90 µJ/cm$^2$ | 1 | 110,000 |
| Invention Example 11 | TABLE I | 110° C. | 0.25 minute | P3 | 1 g VP Disp. CO 1030 | 0.22 g S2 | 90 µJ/cm$^2$ | 2 | 100,000 |
| Comparative Example 7 | TABLE I | 60° C. | 1 minute | P3 | — | 0.22 g S2 | 190 µJ/cm$^2$ | 4 | 40,000 |
| Comparative Example 8 | TABLE I | 90° C. | 1 minute | P3 | — | 0.22 g S2 | 170 µJ/cm$^2$ | 4 | 40,000 |
| Comparative Example 9 | TABLE I | 110° C. | 1 minute | P3 | — | 0.22 g S2 | 145 µJ/cm$^2$ | 5 | 50,000 |
| Comparative Example 10 | TABLE II | 110° C. | 0.5 minute | P3 | — | 0.22 g S2 | 185 µJ/cm$^2$ | 5 | 40,000 |
| Comparative Example 11 | TABLE I | 110° C. | 0.25 minute | P3 | — | 0.22 g S2 | 210 µJ/cm$^2$ | 5 | 30,000 |

The invention has been described in detail with particular reference to certain preferred embodiments thereof, but it will be understood that variations and modifications can be effected within the spirit and scope of the invention.

The invention claimed is:

1. A negative-working imageable element comprising a substrate having thereon an imageable layer comprising:
   a free radical polymerizable component,
   an initiator composition that provide free radicals upon exposure to imaging radiation,
   a radiation absorbing compound,
   a polymeric binder, and
   surface-modified silica particles having a BET surface of from about 120 to about 220 m$^2$/g and that are present in an amount of from about 1 to about 40 weight %, have an average particle size of from about 1 to about 500 nm, have surface hydroxy groups, and the surface-modified silica particles further comprising surface hydrophobic groups that have a carbon content of from about 0.5 to about 4 weight %, which surface hydrophobic groups are alkyl groups having 1 to 30 carbon atoms.

2. The element of claim 1 wherein said surface-modified silica particles are fumed silica particles that are amorphous and have been prepared by milling in the presence of an organic solvent and stabilizing surfactant.

3. The element of claim 1 wherein said surface-modified silica particles are present in said imageable layer in an amount of from about 5 to about 20 weight %.

4. The element of claim 1 wherein said surface-modified silica particles have an average particle size of from about 2 to about 80 nm.

5. The element of claim 1 wherein said surface hydrophobic groups consist essentially of surface alkyl groups having 1 to 18 carbon atoms.

6. The element of claim 1 further comprising a topcoat disposed over said imageable layer.

7. The element of claim 1 wherein said radiation absorbing compound is an infrared radiation absorbing compound that is present in an amount of from about 0.5 to about 30% based on the total dry weight of the layer in which it is disposed.

8. The element of claim 1 wherein said radiation absorbing compound is a UV-sensitive sensitizer that is present in an amount of from about 0.5 to about 30% based on the total dry weight of the layer in which it is disposed.

9. The element of claim 1 that is a lithographic printing plate precursor and said substrate is a hydrophilic aluminum-containing substrate.

10. The element of claim 1 that is a lithographic printing plate precursor that is arranged in a stack as one of a plurality of lithographic printing plate precursors with interleaving paper between each individual lithographic printing plate precursor.

11. A negative-working, infrared radiation-sensitive lithographic printing plate precursor comprising an aluminum-containing substrate having thereon an imageable layer and optionally a topcoat disposed on said imageable layer, said imageable layer comprising:
 a free radical polymerizable component,
 an initiator composition that provide free radicals upon exposure imaging infrared radiation,
 a radiation absorbing compound,
 a polymeric binder, and
 surface-modified silica particles that are present in an amount of from about 5 to about 20 weight %, have an average particle size of from about 2 to about 80 nm, have surface hydroxy groups, a BET surface of from about 120 to about 220 $m^2/g$, and the surface-modified silica particles comprising surface hydrophobic groups that have a carbon content of from about 0.5 to about 4 weight % and that consist essentially of alkyl groups having 1 to 10 carbon atoms.

12. A method of providing an image comprising:
 A) imaging the negative-working imageable element of claim 1 to provide an imaged element with exposed regions and non-exposed regions, and
 B) developing said imaged element to remove predominantly only said non-exposed regions.

13. The method of claim 12 wherein said imageable element is infrared radiation-sensitive and imaging is carried out using an infrared laser at a wavelength of from about 700 to about 1400 nm.

14. The method of claim 12 wherein said imageable element is UV radiation-sensitive and imaging is carried out at a wavelength of from about 250 to about 450 nm.

15. The method of claim 12 wherein said developing is carried out using a developer having a pH of from about 6 to about 13.

16. The method of claim 12 wherein said imageable element further comprises a topcoat disposed over said imageable layer.

* * * * *